(12) United States Patent
Zhang et al.

(10) Patent No.: US 10,396,945 B2
(45) Date of Patent: Aug. 27, 2019

(54) PACKET NUMBER REPRESENTATION FOR MULTICAST CHANNEL BLOCK ERROR RATE REPORTING

(71) Applicant: Nokia Technologies Oy, Espoo (FI)

(72) Inventors: Li Zhang, Beijing (CN); Tero Henttonen, Espoo (FI); Lars Dalsgaard, Oulu (FI); Ilkka Keskitalo, Oulu (FI)

(73) Assignee: NOKIA TECHNOLOGIES OY, Espoo (FI)

(*) Notice: Subject to any disclaimer, the term of this patent is extended or adjusted under 35 U.S.C. 154(b) by 0 days.

(21) Appl. No.: 15/524,721

(22) PCT Filed: Oct. 22, 2015

(86) PCT No.: PCT/US2015/056982
§ 371 (c)(1),
(2) Date: May 5, 2017

(87) PCT Pub. No.: WO2016/073216
PCT Pub. Date: May 12, 2016

(65) Prior Publication Data
US 2017/0359154 A1    Dec. 14, 2017

Related U.S. Application Data

(60) Provisional application No. 62/076,771, filed on Nov. 7, 2014.

(51) Int. Cl.
*H04L 1/20* (2006.01)
*H03M 13/35* (2006.01)
(Continued)

(52) U.S. Cl.
CPC .......... *H04L 1/203* (2013.01); *H03M 13/353* (2013.01); *H04L 12/1863* (2013.01); *H04L 2001/0093* (2013.01)

(58) Field of Classification Search
CPC ......... H04W 4/06; H04W 8/08; H04W 24/10; G06F 11/076; G06F 11/0793;
(Continued)

(56) References Cited

U.S. PATENT DOCUMENTS

2007/0033494 A1* 2/2007 Wenger ............... H04N 19/147
714/776
2007/0070956 A1 3/2007 Seki
(Continued)

FOREIGN PATENT DOCUMENTS

CN    102884856 A    1/2013
TW    201145894 A    12/2011
(Continued)

OTHER PUBLICATIONS

Zhou et al., Improvements of video coding over wireless channel and analysis of error probability and rate control, IEEE, pp. 293-298. (Year: 2003).*
(Continued)

*Primary Examiner* — Shelly A Chase
(74) *Attorney, Agent, or Firm* — Squire Patton Boggs (US) LLP

(57) ABSTRACT

Various communication systems may benefit from appropriate representations of communication parameters and information. For example, certain wireless communication systems may benefit from packet number representation for multicast channel block error rate reporting. A method can include determining a number of packets corresponding to a block error rate of a multicast channel. The method can also include encoding the number of packets using an encoding format that includes a plurality of granularities and at least one threshold. The method can further include transmitting the number of packets in a report.

18 Claims, 2 Drawing Sheets

(51) Int. Cl.
*H04L 12/18* (2006.01)
*H04L 1/00* (2006.01)

(58) Field of Classification Search
CPC .... G06F 11/1076; H04L 1/0021; H04L 1/203; H04L 12/1863; H03M 13/353
See application file for complete search history.

(56) References Cited

U.S. PATENT DOCUMENTS

| | | | |
|---|---|---|---|
| 2010/0130189 | A1 | 5/2010 | Morrison et al. |
| 2010/0172279 | A1 | 7/2010 | Chen et al. |
| 2011/0243066 | A1 | 10/2011 | Nayeb Nazar et al. |
| 2011/0286353 | A1 | 11/2011 | Blanz et al. |
| 2012/0009959 | A1 | 1/2012 | Yamada et al. |
| 2012/0179947 | A1 | 7/2012 | Kato |
| 2017/0177430 | A1* | 6/2017 | Kazmi .................. H04L 1/203 |
| 2018/0206137 | A1* | 7/2018 | Ryu ........................ H04W 4/06 |

FOREIGN PATENT DOCUMENTS

| | | |
|---|---|---|
| WO | 2011/023254 A1 | 3/2011 |
| WO | 2014/113243 A2 | 7/2014 |
| WO | 2014/126421 A1 | 8/2014 |

OTHER PUBLICATIONS

Fan et al., Rate distortion optimization of macroblock based progressive fine granularity scaleable video codec, IEEE, pp. Iv-540-Iv-543. (Year: 2002).*

International Search Report and Written Opinion received for corresponding Patent Cooperation Treaty Application No. PCT/US2015/056982 dated Jan. 6, 2016, 15 pages.

Tentative Rejection received for corresponding Taiwan Patent Application No. 104136692, dated Nov. 1, 2016, 6 pages of Tentative Rejection and 4 pages of translation available.

Tentative Rejection received for corresponding Taiwan Patent Application No. 104136692, dated Sep. 15, 2017, 11 pages of Tentative Rejection and 5 pages of translation available.

Office action received for corresponding Korean Patent Application No. 2017-7015339, dated Mar. 21, 2018, 4 pages of office action and no pages of translation available.

Office action received for corresponding Japanese Patent Application No. 2017-531468, dated Mar. 27, 2018, 5 pages of office action and 4 pages of translation available.

"On MBMS BLER Metric", 3GPP TSG-RAN Working Group 4 meeting #72, R4-145174, Agenda: 7.9.2, Qualcomm Incorporated, Aug. 18-22, 2014, pp. 1-5.

Extended European Search Report received for corresponding European Patent Application No. 15857706.4, dated Jun. 7, 2018, 7 pages.

"MBMS BLER Quantization and Tests", 3GPP TSG-RAN WG4 Meeting #71, R4-142831, Agenda Item: 7.10.3, Huawei, May 19-23, 2014, 5 pages.

"MBSFN BLER Measurements", 3GPP TSG-RAN WG4 Meeting #71, R4-143543, Agenda Item: 7.10.3, Nokia corporation, May 19-23, 2014, 5 pages.

"MBMS BLER Quantization and Tests", 3GPP TSG-RAN WG4 Meeting #72, R4-144313, Agenda Item: 7.9.2, Huawei, Aug. 18-22, 2014, 2 pages.

Japanese Office Action corresponding to Appln. No. 2017-531468, dated Oct. 19, 2018.

European Office Action corresponding to Application No. 15 857 706.4, dated Dec. 7, 2018.

* cited by examiner

PACKET NUMBER REPRESENTATION FOR MULTICAST CHANNEL BLOCK ERROR RATE REPORTING

RELATED APPLICATION

This application was originally filed as PCT Application No. PCT/US2015/056982 filed Oct 22, 2015, which claims priority to U.S. Application No. 62/076771 filed Nov 7, 2014.

BACKGROUND

Field:

Various communication systems may benefit from appropriate representations of communication parameters and information. For example, certain wireless communication systems may benefit from packet number representation for multicast channel block error rate reporting.

Description of the Related Art:

Multimedia broadcast multicast service single frequency network (MBSFN) measurement for minimization of drive tests (MDT) can involve the issue of multicast channel (MCH) block error rate (BLER) reporting. MCH BLER reporting may be associated with number of MCH packets received during an L1 measurement period. The packet number may be reported to facilitate network evaluation/weighting of the reliability of the received BLER report. For example, if a reported BLER is 50% but there are only 4 MCH packets received by the UE, the network may simply ignore the BLER when adjusting the MBSFN transmission parameters based on MDT measurement. Moreover, for MCH BLER, the L1 measurement period may be the same as a logging interval configured via radio resource control (RRC) signaling. There a variety of possible ways to encode the packet number.

For this specific issue of MCH BLER reporting, the range of the possible packet numbers is 0 to 36864, and the range of the possible BLERs is 0.1% to 50%. If 5 bits are used for BLER encoding, 11 bits may be used for packet number encoding, thereby using 16 bits in total, which can fit into 2 octal digits.

With 11 bits and plain representation, the maximum value is 2048. This may not be enough to determine the reliability of small BLER values, and the most proper upper limit is around 10000. Alternatively, with 13 bits and plain representation, the maximum value is 8192. However, 13 bits correspond to 3 octal digits, thus providing a larger signaling overhead than the 11-bit approach. Another option may be a floating representation with an 8-bit mantissa and a 3-bit exponent. The maximum number that can be represented with this number format is 255×128=32640. However, there are many overlapping states with this representation (i.e. multiple different bit presentations will encode the same number).

SUMMARY

According to a first embodiment, a method can include determining a number of packets corresponding to a block error rate of a multicast channel. The method can also include encoding the number of packets using an encoding format comprising a plurality of granularities and at least one threshold. The method can further include transmitting the number of packets in a report.

In a variant, the method can further include receiving the granularities and the at least one threshold via high layer signaling.

In a variant, the method can include receiving the granularities, the threshold(s), or both the granularities and the threshold(s) via high layer signaling and gradually increasing the granularities as a number of received packets increases.

In a variant, multiple thresholds can be used to separate the plurality of granularities.

In a variant, one threshold may be signaled and one or more additional threshold can be derived from the signaled threshold.

In a variant, the method can further include deriving the granularities and the at least one threshold from a configuration.

In a variant, the configuration can be a logging interval.

In a variant, a first granularity of the plurality of granularities is one and a second granularity of the plurality of granularities is eight.

According to a second embodiment, a method can include receiving a report comprising an encoded packet number associated with a block error rate. The method can also include decoding the packet number based on an encoding format comprising a plurality of granularities and at least one threshold. The method can further include weighting or evaluating the block error rate based on the packet number.

In a variant, the method can further include transmitting the granularities and the at least one threshold via high layer signaling.

Variants of the first embodiment may also be applied to the second embodiment.

According to third and fourth embodiments, an apparatus can include means for performing the method according to the first and second embodiments respectively.

In a yet another variant, the method can further include the granularity increase as the function of the number of packets. The granularity can be counted using a specific formula without configuring thresholds to separate granularities.

According to fifth and sixth embodiments, an apparatus can include at least one processor and at least one memory and computer program code. The at least one memory and the computer program code can be configured to, with the at least one processor, cause the apparatus at least to perform the method according to the first and second embodiments respectively.

According to seventh and eighth embodiments, a computer program product may encode instructions for performing a process including the method according to the first and second embodiments respectively.

According to ninth and tenth embodiments, a non-transitory computer readable medium may encode instructions that, when executed in hardware, perform a process including the method according to the first and second embodiments respectively.

According to tenth and eleventh embodiments, a system may include at least one apparatus according to the third or fifth embodiments in communication with at least one apparatus according to the fourth or sixth embodiments, respectively.

BRIEF DESCRIPTION OF THE DRAWINGS

For proper understanding of the invention, reference should be made to the accompanying drawings, wherein.

DETAILED DESCRIPTION

Certain embodiments deal with a packet number representation for multicast channel (MCH) block error rate (BLER) reporting. As noted above, the packet number may be reported to permit the network to evaluate or weight the reliability of a received BLER report. Thus, certain embodiments may provide a way to encode the packet number efficiently. Moreover, certain embodiments may provide enough accuracy to help the network evaluation, while saving signaling in the form of bits used for the representation.

Certain embodiments provide an uneven resolution with fine granularity for the small values, and coarse granularity for large values. One or more threshold to differentiate small and large values, as well as the granularity can be fixed or configurable. If the threshold(s) are configured, they may be explicit or implicit configured.

A flexible representation of packet number is one aspect of certain embodiments. More specifically, in certain embodiments the threshold and granularities can be fixed in a specification. For example, state#0-1023 can be used to represent values 1-1024. From state#1024 the resolution can be 8. For example, state#1024 can have the value of 1024+(1*8), state#1025 can have the value of 1024+(2*8)=1024+16 and so on. The maximum value may then be 1024+1024*8=9216.

Another alternative can be to explicitly signal the threshold and granularities via high layer signaling. The example may be similar to the above, but the threshold of 1024 and the granularities of 1 and 8 can be configurable.

A further alternative can be to explicit signal the threshold, but the granularity can be progressively increased when the number of received packets increases. For example, the threshold can be signaled as 512, then state#0-511 can be used to represent value 1-512, state#512-1023 can be used with granularity 2 (maximum value 512+1024), state#1024-1535 can be used with granularity 4 (maximum value 512+1024+2048), and finally state#1536-2047 can be used with granularity 8 (maximum value 512+1024+2048+4096).

In an additional alternative, a device can derive the threshold and granularities implicitly from other configurations. For example, state#0-1023 can be used to represent value 1-1024 (fixed), and granularity from state#1024 can be calculated as (max_value-1024)/1024. If the logging interval is configured as 10240 ms, the maximum possible value is 6144, so the granularity may be 5.

Figure 1:
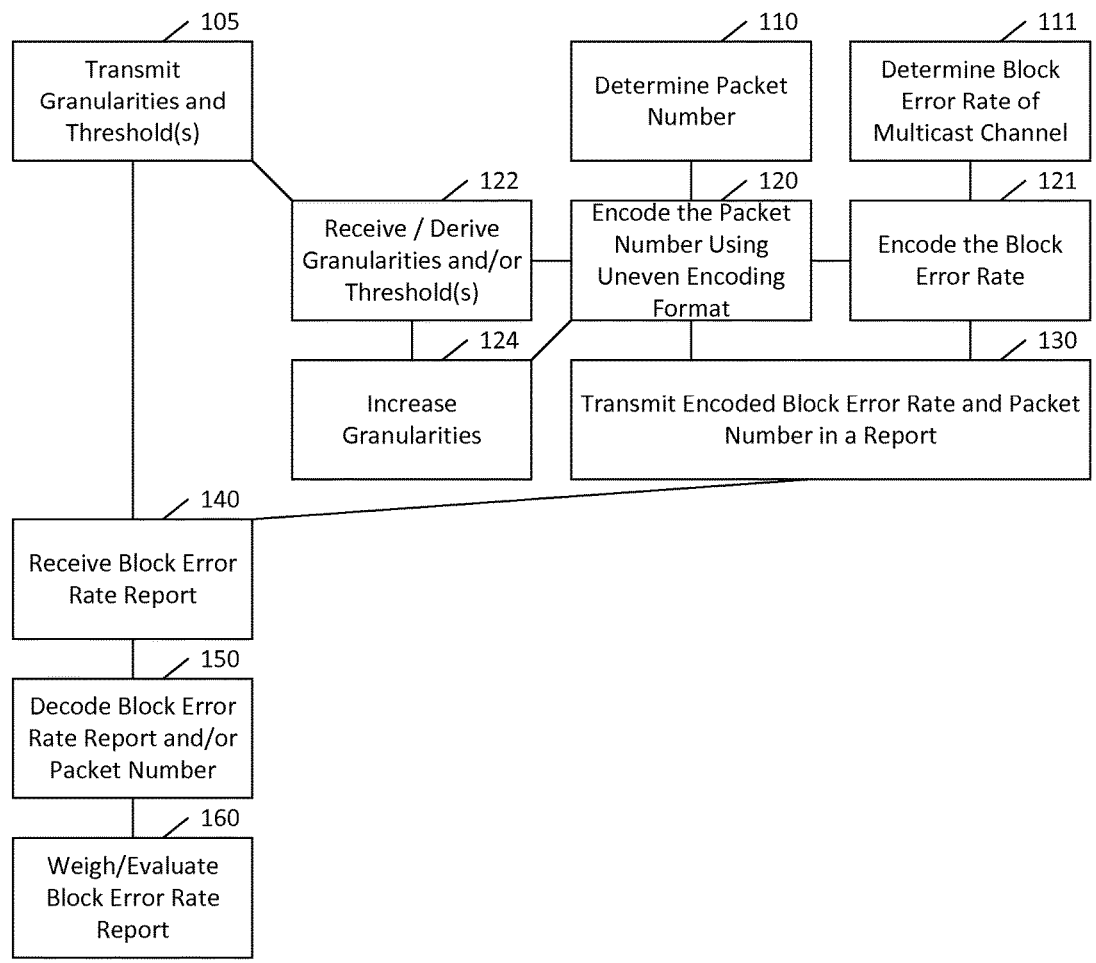
FIG. 1 illustrates a method according to certain embodiments.

FIG. 1 illustrates a method according to certain embodiments. As shown in FIG. 1, a method can include, at 110, determining a packet number corresponding to the number of packets that serve as the basis for a block error rate of a multicast channel. The method can also include, at 111, determining the block error rate of, for example, a multicast channel, by any appropriate technique.

The method can also include, at 120, encoding the packet number using an uneven encoding format, such as an encoding format that includes a plurality of granularities and at least one threshold. Furthermore, the method can include, at 121, encoding the block error rate.

In a variant, a first granularity of the plurality of granularities is one and a second granularity of the plurality of granularities is eight. The threshold can be 1024, as described above. The method can further include, at 130, transmitting the encoded block error rate and packet number in a report.

The method can optionally further include, at 122, receiving the granularities and the at least one threshold via high layer signaling. The method can also or alternatively include deriving the granularities and/or the at least one threshold from another configuration. For example, the granularities and threshold can be derived from a logging interval. Alternatively, or in addition, the method can include receiving the granularities, the threshold(s), or both the granularities and the threshold(s) via high layer signaling and, at 124, gradually increasing the granularities as a number of received packets increases. For example, three thresholds can be used to separate the plurality of granularities, where each granularity can become progressively greater. In certain embodiments, only one or more threshold may be received, while the granularities corresponding to the one more threshold can be specified or otherwise known or derived by the UE.

Thus, in certain embodiments, a UE can determine a block error rate based on N samples. After that, the UE can signal the block error rate together with the value of N to an eNB in a report. The value of N in the report can be flexibly represented using more than one granularity.

The method can further include, at 140, receiving a report including an encoded block error rate and packet number. The method can also include, at 150, decoding the packet number based on an encoding format comprising a plurality of granularities and at least one threshold. This decoding can involve interpreting the reported value in view of known, predicted, or derived granularities and threshold(s). The decoding can further include decoding the block error rate report more generally, by any appropriate mechanism.

The method can also include, at 160, weighting or evaluating the block error rate based on the packet number. For example, values associated with higher number of packets may be given greater weight.

In a variant, the method can further include, at 105, transmitting the granularities and the at least one threshold via high layer signaling. Alternatively, as mentioned above, the granularities and the at least one threshold may be configured by an agreed-upon specification. Other ways of deriving the granularities and/or threshold(s) are also permitted.

Figure 2:
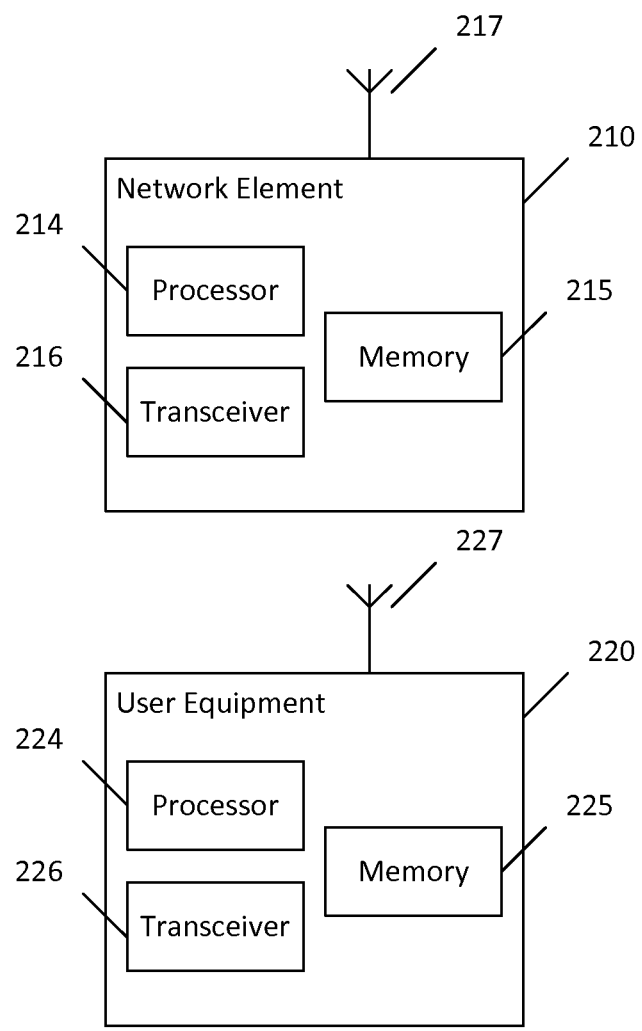
FIG. 2 illustrates a system according to certain embodiments.

FIG. 2 illustrates a system according to certain embodiments of the invention. It should be understood that each block of the flowchart of FIG. 1 may be implemented by various means or their combinations, such as hardware, software, firmware, one or more processors and/or circuitry. In one embodiment, a system may include several devices, such as, for example, network element 210 and user equipment (UE) or user device 220. The system may include more than one UE 220 and more than one network element 210, although only one of each is shown for the purposes of illustration. A network element can be an access point, a base station, an eNode B (eNB), or any other network element. Each of these devices may include at least one processor or control unit or module, respectively indicated as 214 and 224. At least one memory may be provided in each device, and indicated as 215 and 225, respectively. The memory may include computer program instructions or computer code contained therein. One or more transceiver 216 and 226 may be provided, and each device may also include an antenna, respectively illustrated as 217 and 227. Although only one antenna each is shown, many antennas and multiple antenna elements may be provided to each of the devices. Other configurations of these devices, for example, may be provided. For example, network element 210 and UE 220 may be additionally configured for wired communication, in addition to wireless communication, and in such a case antennas 217 and 227 may illustrate any form of communication hardware, without being limited to merely an antenna.

Transceivers 216 and 226 may each, independently, be a transmitter, a receiver, or both a transmitter and a receiver, or a unit or device that may be configured both for transmission and reception. The transmitter and/or receiver (as far as radio parts are concerned) may also be implemented as a remote radio head which is not located in the device itself, but in a mast, for example. It should also be appreciated that according to the "liquid" or flexible radio concept, the operations and functionalities may be performed in different entities, such as nodes, hosts or servers, in a flexible manner. In other words, division of labor may vary case by case. One possible use is to make a network element to deliver local content. One or more functionalities may also be implemented as a virtual application that is provided as software that can run on a server.

A user device or user equipment 220 may be a mobile station (MS) such as a mobile phone or smart phone or multimedia device, a computer, such as a tablet, provided with wireless communication capabilities, personal data or digital assistant (PDA) provided with wireless communication capabilities, portable media player, digital camera, pocket video camera, navigation unit provided with wireless communication capabilities or any combinations thereof. The user device or user equipment 220 may be a sensor or smart meter, or other device that may usually be configured for a single location.

In an exemplifying embodiment, an apparatus, such as a node or user device, may include means for carrying out embodiments described above in relation to FIG. 1.

Processors 214 and 224 may be embodied by any computational or data processing device, such as a central processing unit (CPU), digital signal processor (DSP), application specific integrated circuit (ASIC), programmable logic devices (PLDs), field programmable gate arrays (FPGAs), digitally enhanced circuits, or comparable device or a combination thereof. The processors may be implemented as a single controller, or a plurality of controllers or processors. Additionally, the processors may be implemented as a pool of processors in a local configuration, in a cloud configuration, or in a combination thereof.

For firmware or software, the implementation may include modules or unit of at least one chip set (e.g., procedures, functions, and so on). Memories 215 and 225 may independently be any suitable storage device, such as a non-transitory computer-readable medium. A hard disk drive (HDD), random access memory (RAM), flash memory, or other suitable memory may be used. The memories may be combined on a single integrated circuit as the processor, or may be separate therefrom. Furthermore, the computer program instructions may be stored in the memory and which may be processed by the processors can be any suitable form of computer program code, for example, a compiled or interpreted computer program written in any suitable programming language. The memory or data storage entity is typically internal but may also be external or a combination thereof, such as in the case when additional memory capacity is obtained from a service provider. The memory may be fixed or removable.

The memory and the computer program instructions may be configured, with the processor for the particular device, to cause a hardware apparatus such as network element 210 and/or UE 220, to perform any of the processes described above (see, for example, FIG. 1). Therefore, in certain embodiments, a non-transitory computer-readable medium may be encoded with computer instructions or one or more computer program (such as added or updated software routine, applet or macro) that, when executed in hardware, may perform a process such as one of the processes described herein. Computer programs may be coded by a programming language, which may be a high-level programming language, such as objective-C, C, C++, C#, Java, etc., or a low-level programming language, such as a machine language, or assembler. Alternatively, certain embodiments of the invention may be performed entirely in hardware.

Furthermore, although FIG. 2 illustrates a system including a network element 210 and a UE 220, embodiments of the invention may be applicable to other configurations, and configurations involving additional elements, as illustrated and discussed herein. For example, multiple user equipment devices and multiple network elements may be present, or other nodes providing similar functionality, such as nodes that combine the functionality of a user equipment and an access point, such as a relay node.

Certain embodiments may provide various benefits and/or advantages. An advantage of the flexible representation according to certain embodiments may be that signaling overhead can be kept to a minimum or desired level. Moreover, in certain embodiments most relevant information can be provided by an uneven resolution for small and large values. The principle can be re-used also in future cases where such counting numbers need to be reported.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention.

We claim:

1. A method, comprising:
    determining a number of packets corresponding to a block error rate of a multicast channel;
    encoding the number of packets using an encoding format comprising a plurality of granularities and at least one threshold, wherein multiple thresholds are used to separate the plurality of granularities; and
    transmitting the number of packets in a report.

2. The method of claim 1, further comprising:
    receiving the granularities and the at least one threshold via high layer signaling.

3. The method of claim 1, further comprising:
    receiving the granularities, the threshold(s), or both the granularities and the threshold(s) via high layer signaling and gradually increasing the granularities as a number of received packets increases.

4. The method of claim 1, wherein one threshold is signaled and one or more additional threshold are derived from the signaled threshold.

5. The method of claim 1, further comprising:
deriving the granularities and the at least one threshold from a configuration.

6. The method of claim 5, wherein the configuration comprises a logging interval.

7. The method of claim 1, wherein a first granularity of the plurality of granularities is one and a second granularity of the plurality of granularities is eight.

8. The method of claim 1, wherein a granularity increases as a function of a number of packets, wherein the granularity can be counted using a specific formula without configuring thresholds to separate granularities.

9. An apparatus, comprising:
at least one processor; and
at least one memory including computer program code,
wherein the at least one memory and the computer program code are configured to, with the at least one processor, cause the apparatus at least to
determine a number of packets corresponding to a block error rate of a multicast channel;
encode the number of packets using an encoding format comprising a plurality of granularities and at least one threshold, wherein multiple thresholds are used to separate the plurality of granularities; and
transmit the number of packets in a report.

10. The apparatus of claim 9, wherein the at least one memory and the computer program code are configured to, with the at least one processor, cause the apparatus at least to receive the granularities and the at least one threshold via high layer signaling.

11. The apparatus of claim 9, wherein the at least one memory and the computer program code are configured to, with the at least one processor, cause the apparatus at least to receive the granularities, the threshold(s), or both the granularities and the threshold(s) via high layer signaling and gradually increasing the granularities as a number of received packets increases.

12. The apparatus of claim 9, wherein one threshold is signaled and one or more additional threshold are derived from the signaled threshold.

13. The apparatus of claim 9, wherein the at least one memory and the computer program code are configured to, with the at least one processor, cause the apparatus at least to derive the granularities and the at least one threshold from a configuration.

14. The apparatus of claim 13, wherein the configuration comprises a logging interval.

15. The apparatus of any claim 9, wherein a first granularity of the plurality of granularities is one and a second granularity of the plurality of granularities is eight.

16. The apparatus of claim 9, wherein a granularity increases as a function of a number of packets, wherein the granularity can be counted using a specific formula without configuring thresholds to separate granularities.

17. An apparatus, comprising:
at least one processor; and
at least one memory including computer program code,
wherein the at least one memory and the computer program code are configured to, with the at least one processor, cause the apparatus at least to
receive a report comprising an encoded packet number associated with a block error rate;
decode the packet number based on an encoding format comprising a plurality of granularities and at least one threshold, wherein multiple thresholds are used to separate the plurality of granularities; and
weight or evaluate the block error rate based on the packet number.

18. The apparatus of claim 17, wherein the at least one memory and the computer program code are configured to, with the at least one processor, cause the apparatus at least to transmit the granularities and the at least one threshold via high layer signaling.

* * * * *